United States Patent
Bewlay et al.

(10) Patent No.: US 10,018,113 B2
(45) Date of Patent: Jul. 10, 2018

(54) ULTRASONIC CLEANING SYSTEM AND METHOD

(71) Applicant: General Electric Company, Schenectady, NY (US)

(72) Inventors: Bernard Patrick Bewlay, Niskayuna, NY (US); Waseem Faidi, Niskayuna, NY (US); Peter William Lorraine, Niskayuna, NY (US); Mohamed Ahmed Ali, West Chester, OH (US); Siavash Yazdanfar, Niskayuna, NY (US); Ying Fan, Niskayuna, NY (US); Edward James Nieters, Burnt Hills, NY (US); David Mills, Niskayuna, NY (US); Nicole Tibbetts, Niskayuna, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 279 days.

(21) Appl. No.: 14/938,590

(22) Filed: Nov. 11, 2015

(65) Prior Publication Data
US 2017/0130649 A1  May 11, 2017

(51) Int. Cl.
*B08B 3/12* (2006.01)
*F02B 77/04* (2006.01)
(Continued)

(52) U.S. Cl.
CPC ............... *F02B 77/04* (2013.01); *B08B 3/12* (2013.01); *B08B 7/028* (2013.01); *B08B 9/0321* (2013.01);
(Continued)

(58) Field of Classification Search
CPC .. B08B 3/08; B08B 3/12; B08B 3/044; B08B 3/10; B08B 7/028; B08B 9/0321;
(Continued)

(56) References Cited

U.S. PATENT DOCUMENTS 2,924,542 A * 2/1960 Giammaria ............. F02B 77/04
134/1
3,173,034 A * 3/1965 Dickey ..................... B08B 3/12
134/1
(Continued)

FOREIGN PATENT DOCUMENTS

CN 1868616 A 11/2006
CN 103813863 A 5/2014
(Continued)

OTHER PUBLICATIONS

Partial European Search Report issued in connection with corresponding EP Application No. 16196738.5 dated Mar. 17, 2017.
(Continued)

*Primary Examiner* — Sharidan Carrillo
(74) *Attorney, Agent, or Firm* — GE Global Patent Operation; Nitin Joshi

(57) ABSTRACT

A cleaning system and method use an ultrasound probe, a coupling mechanism, and a controller to clean equipment of a vehicle system. The ultrasound probe enters into an engine. The ultrasound probe emits ultrasound pulses and the coupling mechanism provides an ultrasound coupling medium between the ultrasound probe and one or more components of the engine. The controller drives the ultrasound probe to deliver the ultrasound pulse through the coupling medium to a surface of the one or more components of the engine. The ultrasound probe delivers the ultrasound pulse to remove deposits from the one or more components of the engine.

9 Claims, 5 Drawing Sheets

(51) Int. Cl.
  *B08B 9/032* (2006.01)
  *B08B 7/02* (2006.01)
  *F01D 25/00* (2006.01)
  *B08B 3/08* (2006.01)
  *B08B 3/04* (2006.01)
  *H01L 21/67* (2006.01)
  *H01L 21/02* (2006.01)
  *B08B 3/10* (2006.01)

(52) U.S. Cl.
  CPC ............ *F01D 25/002* (2013.01); *B08B 3/044* (2013.01); *B08B 3/08* (2013.01); *B08B 3/10* (2013.01); *H01L 21/02076* (2013.01); *H01L 21/67057* (2013.01); *H01L 21/67236* (2013.01)

(58) Field of Classification Search
  CPC ......... H01L 21/02076; H01L 21/67057; H01L 21/67236; H01L 21/6836; F02B 77/04
  See application file for complete search history.

(56) References Cited

U.S. PATENT DOCUMENTS

| | | | |
|---|---|---|---|
| 3,446,666 A * | 5/1969 | Bodine | B08B 3/12 134/1 |
| 3,946,599 A | 3/1976 | Patt | |
| 6,663,718 B1 * | 12/2003 | Mush | B08B 9/00 123/198 A |
| 7,531,048 B2 | 5/2009 | Woodcock et al. | |
| 8,628,627 B2 | 1/2014 | Sales | |
| 2002/0100492 A1 * | 8/2002 | Risbeck | B08B 7/0042 134/1 |
| 2003/0084535 A1 | 5/2003 | DuVal et al. | |
| 2006/0219269 A1 | 10/2006 | Rice et al. | |
| 2007/0068551 A1 * | 3/2007 | Garimella | B08B 3/02 134/1 |
| 2013/0220004 A1 * | 8/2013 | Epstein | G01M 15/14 73/112.01 |
| 2014/0034091 A1 | 2/2014 | Dorshimer et al. | |
| 2014/0144473 A1 | 5/2014 | Martin | |
| 2017/0130649 A1 * | 5/2017 | Bewlay | B08B 9/0321 |

FOREIGN PATENT DOCUMENTS

| | | |
|---|---|---|
| DE | 195 40 373 A1 | 5/1997 |
| EP | 2 752 559 A1 | 7/2014 |
| JP | 5520673 A | 2/1980 |
| JP | 2007063998 A | 3/2007 |
| JP | 2007090344 A | 4/2007 |
| JP | 2007285181 A | 11/2007 |
| JP | 2011078894 A | 4/2011 |
| JP | 2015128745 A | 7/2015 |
| TW | I246944 B | 1/2006 |
| TW | 201521889 A | 6/2015 |
| WO | 2006/084308 A1 | 8/2006 |
| WO | WO-2007147723 A2 * | 12/2007 ............... B08B 3/12 |
| WO | 2015051146 A1 | 4/2015 |
| WO | 2015126585 A1 | 8/2015 |

OTHER PUBLICATIONS

Weingartner, "Advances in Engine Maintenance", An MTU Aero Engines Company, pp. 1-10, Oct. 29, 2010.
"On-wing washing system using injected water or detergent which penetrates deep into the engine, cleaning performance stealing contaminants."Aero Jet Wash LLC, http://www.aerojetwash.com/services.html, p. 1.
Culjat, Martin O. et al. "Evaluation of gallium-indium alloy as an acoustic couplant for high-impedance, high-frequency applications" pp. 125-130, Published Online Jun. 10, 2005.
Machine Translation and Office Action issued in connection with corresponding TW Application No. 105135638 dated Sep. 7, 2017.
Unofficial English Translation of Japanese Office Action issued in connection with corresponding JP Application No. 2016214741 on Feb. 20, 2018.

* cited by examiner

ULTRASONIC CLEANING SYSTEM AND METHOD

FIELD

Embodiments of the subject matter disclosed herein relate to systems and methods for cleaning equipment such as engines and parts of engines.

BACKGROUND

Equipment such as engines can accumulate deposits over time. For example, engines coupled with wings of aircraft can accumulate deposits (deposits formed from sand, dust, and/or other materials) on exterior surfaces and/or internal surfaces. These and other types of deposits can degrade engine performance. Eventually, the deposits must be cleaned from the engines and engine parts.

Current cleaning systems and methods remove the engine and/or engine parts from the larger turbine system (e.g., the aircraft) so that the engine and/or engine parts can be cleaned. This type of cleaning can take the turbine system out of operation for a significant period of time. As a result, the system may not be used during this period of time. Additionally, the manual effort involved in decoupling the engine from the system, taking one or more parts of the engine apart for cleaning, re-assembling the engine after cleaning, and re-connecting the engine with the system can be significant. A need exists for an easier and/or more efficient cleaning of equipment such as engines of vehicles.

BRIEF DESCRIPTION

In one embodiment, a cleaning system includes an ultrasound probe, a coupling mechanism, a scanning mechanism, and a controller. The ultrasound probe is configured to enter into an engine while the engine is one or more of coupled with or disposed within a vehicle. The ultrasound probe also is configured to emit an ultrasound pulse. The coupling mechanism is configured to provide an ultrasound coupling medium between the ultrasound probe and one or more components of the engine. The ultrasound probe is configured to be scanned, manually, automatically, or in a way that combines both manual and automatic scanning, to cover the region of deposits to be cleaned. The controller is configured to drive the ultrasound probe to deliver the ultrasound pulse through the coupling medium to a surface of the one or more components of the engine. The ultrasound probe is configured to deliver the ultrasound pulse to remove deposits from the one or more components of the engine while the engine is one or more of coupled with or disposed within the vehicle.

In another embodiment, a method (e.g., for cleaning equipment of a system) includes inserting an ultrasound probe into an engine while the engine is one or more of coupled with or disposed within a vehicle, delivering an ultrasound coupling medium between the ultrasound probe and one or more components of the engine, and emitting an ultrasound pulse from the ultrasound probe and through the coupling medium to a surface of the one or more components of the engine. The ultrasound pulse removes deposits from the one or more components of the engine while the engine is one or more of coupled with or disposed within the vehicle.

In another embodiment, a system (e.g., a cleaning system) includes an ultrasound probe and a controller. The ultrasound probe is configured to enter into equipment while the engine is coupled with or disposed within a vehicle system. The ultrasound probe also is configured to emit an ultrasound pulse. The controller is configured to drive the ultrasound probe to deliver the ultrasound pulse to a surface of the one or more components of the engine. The ultrasound probe also is configured to deliver the ultrasound pulse to remove deposits from the one or more components of the engine while the engine is one or more of coupled with or disposed within the vehicle.

BRIEF DESCRIPTION OF THE DRAWINGS

Reference is made to the accompanying drawings in which particular embodiments and further benefits of the invention are illustrated as described in more detail in the description below, in which.

DETAILED DESCRIPTION

Figure 1:
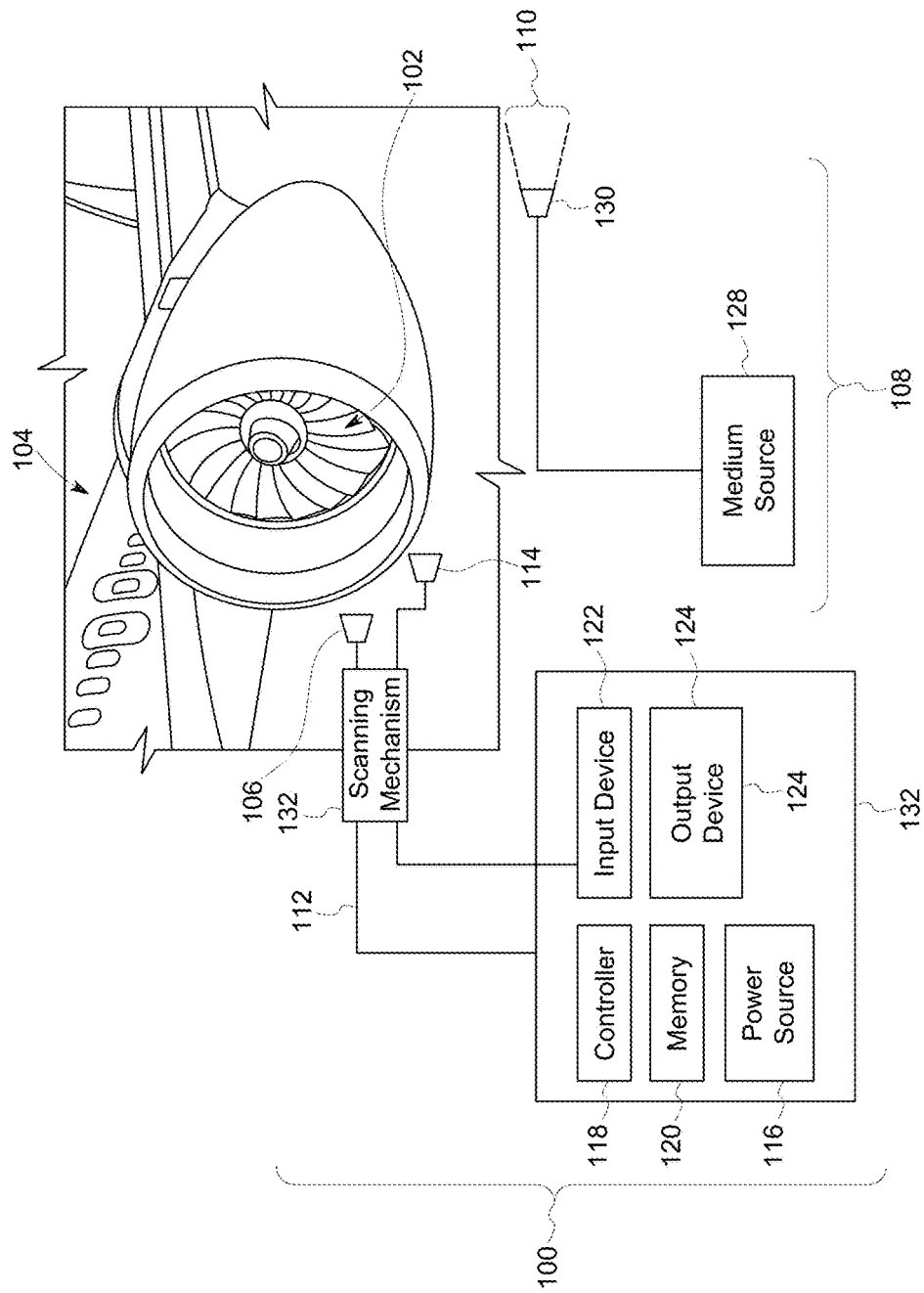
FIG. 1 illustrates one embodiment of an equipment cleaning system.

One or more embodiments of the inventive subject matter described herein provide systems and methods for cleaning equipment of systems, such as engines of vehicles. The systems and methods can clean the engines and/or parts of the engines while the engines remain connected with the vehicles. The engines and engine parts may be cleaned to remove sand accumulation or other deposits on engine parts, such as turbine blades (e.g., high pressure turbine blades) and nozzles, combustor liners, compressor blades, etc.

In one embodiment, the cleaning systems and methods use delivery mechanisms to apply end effectors described herein to engine parts in-situ while the engine is coupled with the vehicle (e.g., while the engine is on a wing of an aircraft). Alternatively, the systems and methods can clean the engine while the engine is off-wing, such as in a service shop. The techniques described herein can be applied for other ground-based equipment (e.g., turbines) where cleaning is needed. A focused ultrasound probe may be used to emit ultrasound waves that remove deposits from the engine. The deposits that are removed can include sand or other materials that are not part of the engine. The probe may emit ultrasound waves having frequencies of at least 50 kHz to no more than 100 MHz, but alternatively may have other frequencies. The probe may have a circular or rectangular geometry, and may be acoustically coupled with the engine by a fluid that is disposed on the engine (e.g., by flooding the internal portions of a blade with water or another fluid, by spraying water or another fluid onto the engine, etc.). Optionally, a diaphragm (e.g., a balloon) that is at least partially filled with water or another fluid may be disposed between and engaged with the deposits and the ultrasound probe for acoustically coupling the probe with the deposits.

The ultrasound waves emitted by the probe can be focused on the deposits (e.g., the sand) and not on the materials forming the engine or coatings of the engine. For example, some engines and/or engine parts may be coated with a thermal barrier coating (TBC). The probe can focus the ultrasound waves so that a focal point of the waves is on or inside the deposits, but not inside, on, or beneath the thermal barrier coating on the exterior surface of the engine. The ultrasound waves create bubble oscillations and collapse, which in turn generates shockwaves that destroy and/or disbond the deposit. The size and geometry of the ultrasound probe are selected to permit delivering the probe to the component to be cleaned through engine access channels, which may be relatively small (e.g., several millimeters or centimeters across). The geometric focal length of the probe is selected to increase or maximize the focus gain of the ultrasound beam, while avoiding total reflection of any part of the ultrasound beam. For example, when the access channel is a circular borescope access hole of 0.5-inch diameter, the ultrasound probe may be selected to have a circular aperture of 0.5-inch diameter and a geometric focal length of 1.0-inch. The focal length will increase or maximize the focus gain, while avoiding total reflection of any part of the ultrasound beam.

Figure 2:
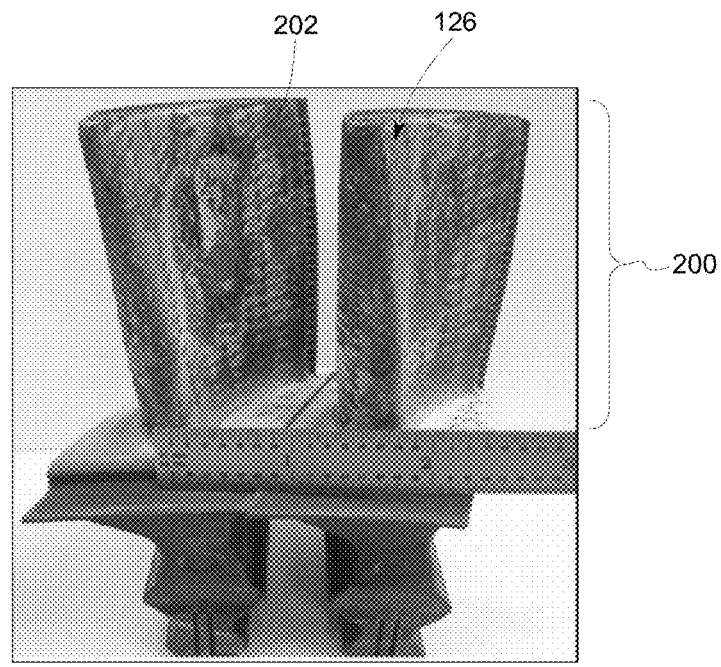
FIG. 2 illustrates one example of a component of equipment shown in FIG. 1.

FIG. 1 illustrates one embodiment of an ultrasonic equipment cleaning system 100. The cleaning system 100 may be used to clean equipment 102, such as an engine, while the equipment is coupled with a turbine system 104 that uses the engine, such as a vehicle (e.g., an aircraft). While the description herein focuses on using the cleaning system 100 to clean an engine of an aircraft while the engine is coupled with a wing of the aircraft, alternatively, the cleaning system 100 may be used to clean another type of equipment, equipment that is not coupled with a vehicle, and/or equipment that is for another type of vehicle or system. FIG. 2 illustrates one example of a component 200 of the equipment 102 shown in FIG. 1. The component 200 shown in FIG. 2 is a portion of high pressure turbocharger blades. The component 200 has several deposits 202 of material, such as sand, on the exterior surface 126 of the component 200.

Returning to the description of the cleaning system 100 shown in FIG. 1, the cleaning system 100 includes a probe 106 that is inserted into the turbine system 104 for cleaning the equipment 102. The probe 106 may be sufficiently small to allow the probe 106 to enter into small locations of the turbine system 104 and/or equipment 102, such as through a borescope inspection holes, or borescope holes, of the equipment 102. For example, some openings through which the probe 106 may extend in order to clean the equipment 102 may be as small as one eighth of an inch (or no larger than 3.175 millimeters). In one embodiment, the probe 106 represents an ultrasound transducer that emits focuses ultrasound pulses to clean the equipment 102. The probe 106 may detect echoes of the ultrasound pulses for investigative and/or diagnostic purposes, as described herein.

A coupling mechanism 108 of the cleaning system 100 provides a coupling medium 110 between the probe 106 and one or more components of the equipment 102. In the illustrated embodiment, the coupling mechanism 108 includes a nozzle 130 that delivers a fluid as the coupling medium 110 by spraying or otherwise directing the fluid onto and/or into the equipment 102. For example, the nozzle 130 may spray water, oil, or the like, onto exterior and/or interior surfaces of the equipment 102. Alternatively, the coupling mechanism 108 may include a diaphragm that is at least partially filled with the coupling medium 110, as described below. The coupling mechanism 108 can include a source 128 of the coupling medium 110, such as a tank or other container that holds water or another fluid.

The probe 106 is connected to an elongated connector 112, such as a cable, that is sufficiently small to allow the probe 106 to be inserted into the turbine system 104 and/or equipment 102 to remove deposits on and/or in the equipment 102 while a power source 116 and/or controller 118 of the cleaning system 100 are disposed outside of the turbine system 104 and/or equipment 102. The power source 116 can represent one or more batteries that supply electric current to power the cleaning system 100 and/or connectors that connect with an external source of electric current, such as a utility grid, to power the cleaning system 100. The controller 118 represents hardware circuitry that includes and/or is connected with one or more processors (e.g., microprocessors, integrated circuits, field programmable gate arrays, or other electronic logic-based devices) that control operation of the cleaning system 100. The controller 118 may operate based off of instructions received from a manual operator and/or software that is stored on a memory 120 of the cleaning system 100. The memory 120 can represent computer readable medium and/or the software instructions stored therein, such as a computer hard drive, flash memory, or the like. An input device 122 of the cleaning system 100 receives input from outside sources (e.g., an operator of the cleaning system 100), and can include a touchscreen, keyboard, electronic mouse, stylus, etc. An output device 124 of the cleaning system 100 provides output to an operator, and can include a touchscreen (e.g., the same or different touchscreen as the input device 122), monitor, speaker, etc.

The controller 118 drives the probe 106 to deliver ultrasound pulses through the coupling medium 110 to a surface 126 of one or more components of the equipment 102. The probe 106 can include piezoelectric elements or bodies that are electronically powered to emit ultrasound pulses and/or that can detect echoes of the pulses. The surface 126 can include an external or internal surface of the equipment 102, as described herein. The distal end or tip of the probe 106 may be placed into contact with the coupling medium 110 on the equipment 102 and emit ultrasound waves. The coupling medium 110 may acoustically conduct the ultrasound waves from the probe 106 to the deposits on the equipment 102. The probe 106 delivers the ultrasound pulses to remove deposits from the equipment 102 while the equipment 102 is coupled with and/or disposed within the turbine system 104 (e.g., the vehicle). In one embodiment, the probe 106 delivers the ultrasound pulses to remove the deposits while the equipment 102 is mounted to a wing of an aircraft. The probe 106 can focus the pulses to clean one or more components of the equipment 102, such as one or more high pressure turbocharger blades, nozzles, combustor liners, compressor blades, etc., of an engine.

In one embodiment, the input device 122 of the cleaning system 100 includes and/or is connected with an optical sensor 114, such as a camera. The optical sensor 114 can be inserted into the equipment 102 in order to generate optical data representative of the equipment 102. For example, a camera may be inserted into the equipment to determine the amount and/or location of deposits on the equipment 102, which can be presented to an operator of the cleaning system 100 to determine whether a previous cleaning of the equipment 102 removed the deposits, to determine where the deposits are located, etc.

The cleaning system 100 optionally may include a scanning mechanism 132 that moves one or more of the probe 106 and/or the sensor 114. The scanning mechanism 132 can represent one or more motors, gears, or the like, that translate energy received from the power source into movement of the probe 106 and/or sensor 114 relative to the equipment 102. The scanning mechanism 132 may be connected with the probe 106 and/or the sensor 114 to allow the controller 118 to automatically move the probe 106 and/or sensor 114 in the equipment 102, to allow an operator input instructions via the input device 122 to manually move the probe 106 and/or sensor 114 in the equipment 102 (e.g., in locations where the operator is unable to manually reach), and/or to allow for both manual and/or automatic movement of the probe 106 and/or sensor 114.

Figure 3:
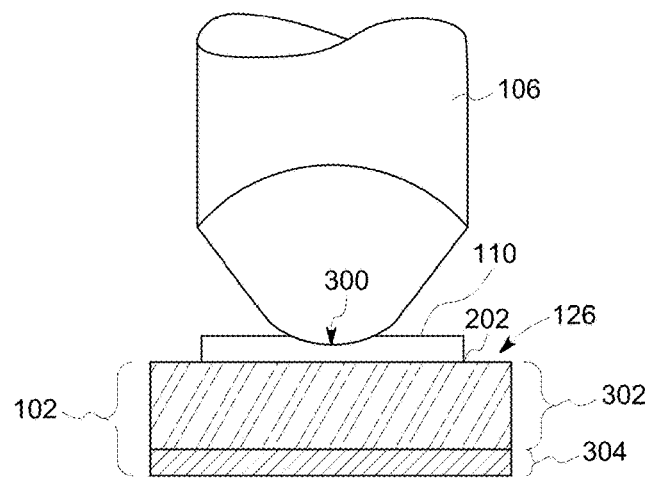
FIG. 3 illustrates a probe of the cleaning system shown in FIG. 1 during removal of deposits from an exterior surface of the equipment according to one example.

FIG. 3 illustrates the probe 106 of the cleaning system 100 shown in FIG. 1 during removal of deposits 202 from an exterior surface 126 of the equipment 102 according to one example. A distal end or tip 300 of the probe 106 is placed into contact with the coupling medium 110. The coupling medium 110 extends between and is in contact with the probe 106 and the surface 126 of the equipment 102. The equipment 102 may include an external metal layer 302 and a thermal barrier coating (TBC) 304 beneath the surface 302. The deposits 202 may be on the metal layer 302 and the controller 118 (shown in FIG. 1) can focus the ultrasound pulses emitted by the probe 106 such that the pulses are focused on the metal layer 302 and/or deposits 202 to remove the deposits 202, but do not damage and are not focused on the TBC 304. As a result, the TBC 304 is protected from damage or removal by the ultrasound pulses. The probe 106 can be moved or scanned relative to the equipment 102 in order to remove the deposits 202 from different areas of the equipment 102. For example, the probe 106 may not be fixed in one location and scanned in a manual, automated, or in a way the combines both manual and automatic scanning.

Figure 4:
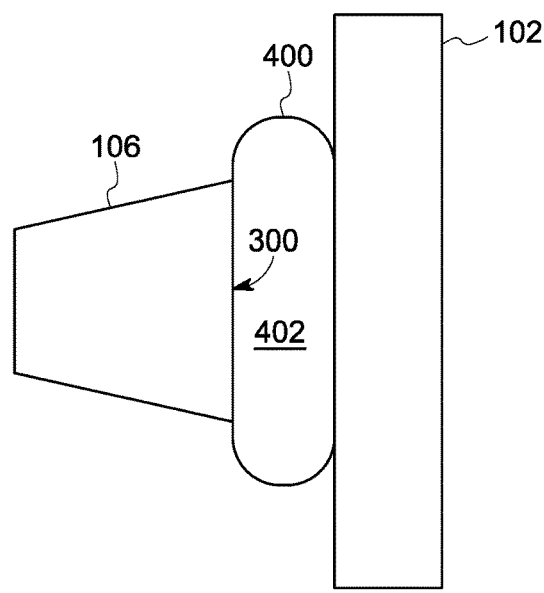
FIG. 4 illustrates another embodiment of a coupling mechanism.

FIG. 4 illustrates another embodiment of a coupling mechanism 400. The coupling mechanism 400 can include a diaphragm or other flexible bladder 402 that is at least partially filled with a coupling fluid. The diaphragm 402 may be connected with the distal end 300 of the probe 106. The probe 106 may be moved toward the equipment 102 so that the diaphragm 402 is compressed between the probe 106 and the equipment 102, as shown in FIG. 4. The coupling fluid in the diaphragm 402 may then acoustically couple the probe 106 with the equipment 102 such that ultrasound pulses emitted by the probe 106 can propagate through the diaphragm 402 and coupling fluid into the equipment 102 to remove the deposits 202, as described above.

Optionally, the distal end 300 of the probe 106 may include a low attenuation, high acoustic impedance material, such as gallium or gallium-indium alloy, as the coupling medium or coupling mechanism. For example, a layer or body of gallium, gallium-indium alloy, or another material may be disposed on the probe 106 and may conduct the ultrasound pulses from the probe 106 into the equipment 102 through the layer or body.

Figure 5:
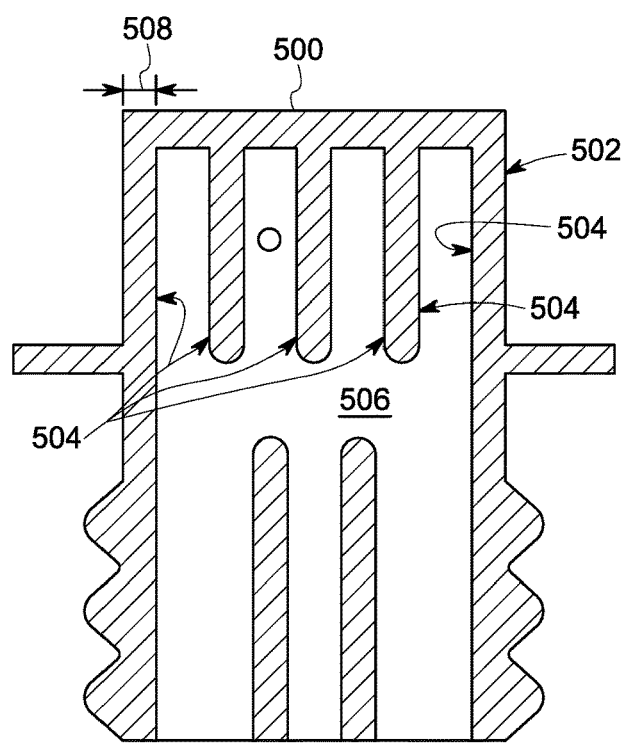
FIG. 5 illustrates a cross-sectional view of another component of the equipment shown in FIG. 1 according to one embodiment.

FIG. 5 illustrates a cross-sectional view of another component 500 of the equipment 102 shown in FIG. 1 according to one embodiment. The component 500 can represent a high pressure turbine blade or another component of the equipment 102. The component 500 includes both exterior surfaces 502 and opposite interior surfaces 504. The cleaning system 100 shown in FIG. 1 can remove deposits 202 (shown in FIG. 2) from the exterior surfaces 502 (as described above in connection with FIG. 4) and also from the interior surfaces 504. The interior surfaces 504 at least partially extend around and define one or more interior chambers or internal cavities 506 of the equipment 102.

In one embodiment, the cleaning system 100 can remove deposits 202 from the interior surfaces 504 without the probe 106 being located inside the component 500 (e.g., without the probe 106 being inside the interior chambers 506). The probe 106 can be located outside of the interior chambers 506 with the distal end 300 of the probe 106 being in contact with the coupling medium 110, which also is in contact with the exterior surface 502 of the component 500. The controller 118 (shown in FIG. 1) can vary the frequency of the ultrasound pulses to change where the ultrasound pulses are focused. The pulses can propagate through the coupling medium 110 in contact with the exterior surface 502, through the material forming the component 500, and be focused on the interior surface 504 (or at the interface between the interior surface 504 and the deposits 202 on the interior surface 504.

Optionally, the coupling medium 110 may be disposed inside the interior chamber 506 of the component 500. For example, the nozzle 130 (shown in FIG. 1) may spray the coupling medium 110 into the interior chamber 506 to fill and/or partially fill the interior chamber 506 with the coupling medium 110. The probe 106 may be placed into contact with the exterior surface 502 (and/or in contact with the coupling medium 110 that is between the probe 106 and the exterior surface 502). The probe 106 can then direct ultrasound pulses toward the interior chamber 506 to cause acoustic effects (e.g., cavitation) about the interior chamber 506. The acoustic effects can include cavitation, oscillation, and/or vibration, and can remove the deposits 202 from the internal surface 504. Acoustic effects (e.g., cavitation) can involve the generation and oscillation of bubbles (e.g., vacuum or gas-filled cavities) in the coupling medium 110. The bubbles can act on and remove the deposits 202 from the surfaces of the equipment. In one aspect, the frequency of the ultrasound pulses may be limited to ensure that the bubbles are sufficiently small to remove the deposits. For example, the ultrasound pulses may be generated to have a frequency of at least 50 kHz (or another value).

In one embodiment, the controller 118 changes the frequency of the ultrasound pulses delivered by the probe 106 such that a thickness dimension 508 of the component 500 is an odd integer multiple of one half of the wavelength of the ultrasound pulse. Alternatively, the thickness dimension 508 may be an odd integer multiple of the wavelength of the ultrasound pulses. The thickness dimension 508 represents the distance between the exterior surface 502 and the interior surface 504. Matching the wavelengths of the ultrasound pulses to the thickness dimension 508 of the component 500 can increase or maximize the ultrasound energy that is transmitted through the component 500 and create the oscilliation strength needed to remove deposits 202 on the interior surfaces 504. Propagation of the pulses incident on the component 500 can cause a significant decrease in the pressure generated by the ultrasound pulses, such as the pressure gain decreasing by a factor of at least nine. But, by emitting the pulses such that the thickness dimension 508 is an odd integer multiple of a half wavelength of the pulses, the pressure generated by the pulses decreases, but by a smaller factor. For example, if the thickness dimension 508 is three millimeters, then the ultrasound pulses may have a wavelength of six millimeters in order to clean the interior surfaces 504 without the probe 106 entering into the interior chambers 506 of the equipment 102. Using a low attenuation, high impedance coupling medium, such gallium or gallium-indium alloy, reduces the dependence of the transmission coefficient on variations in the equipment wall thickness, due to manufacturing errors, wear during operations, or other factors. For example, if the ultrasound pulse has a wavelength of 6 millimeters and the equipment wall thickness is 2.7 millimeters, which is 10% different than the intended design value of 3 millimeters, the transmission coefficient will be 93% with a gallium-indium alloy used as a coupling medium, compared to 20% for a water coupling medium. The energy of the ultrasound pulses may be sufficiently low to prevent damage to interfaces, coatings, and the like, as described herein.

The controller 118 may direct the probe 106 to emit one or more investigative or diagnostic ultrasound pulses into the equipment 102. These pulses are ultrasound pulses used for diagnostic and/or investigative purposes. For example, the pulses may be directed into the equipment 102 in order to identify and/or locate the presence of deposits 202 on the exterior and/or interior surfaces 502, 504 of the equipment 102. The probe 106 can emit the pulses into the equipment 102 and detect echoes of the pulses. Based on the echoes, the controller 118 can determine where deposits 202 are located. For example, the presence of the deposits 202 can change the echoes such that, for a clean component 500, the echoes appear different than the echoes reflected off of a component 500 having deposits on the exterior and/or interior surfaces 502, 504. Optionally, the controller 118 may determine the thickness dimension 508 of the component 500 using the echoes. Different echoes may represent different thickness dimensions 508, and the controller 118 can determine the thickness dimension 508 based on the received echoes. The controller 118 may then direct the probe 106 to emit the ultrasound pulses to remove the deposits 202 using the locations of the deposits 202 and/or the thickness dimensions 508 of the component 500 that are determined using the investigative pulses. Optionally, the diagnostic ultrasound pulses may have different frequencies than the cleaning ultrasound probes, which may be more suitable to locate and measure the thickness of the deposits. The diagnostic ultrasound pulses may also be emitted by a smaller probe that is concentric to the cleaning ultrasound probe and operates at the desired diagnostic frequencies. The smaller diagnostic probe may be placed inside a cut-out that is concentric to the cleaning ultrasound probe.

Figure 6:
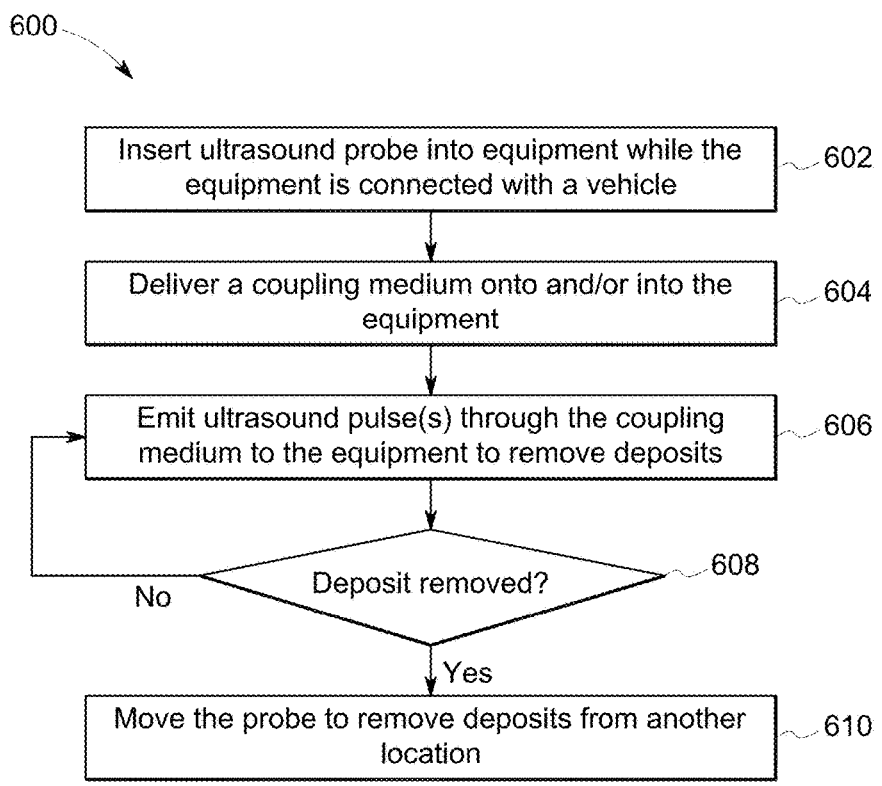
FIG. 6 illustrates a flowchart of one embodiment of a method for cleaning equipment of a system.

FIG. 6 illustrates a flowchart of one embodiment of a method 600 for cleaning equipment of a system. The method 600 may be used to clean the equipment 102 (e.g., an engine) while the equipment 102 remains coupled with a system, such as a vehicle (e.g., an aircraft). At 602, an ultrasound probe is inserted into equipment while the equipment remains connected with a system that the equipment operates to power or provide work. For example, the probe 106 may be inserted into an engine while the engine remains connected with a wing of an aircraft or with another vehicle. At 604, a coupling medium is delivered onto and/or into the equipment. For example, a fluid may be sprayed onto an exterior surface of the equipment being cleaned, a fluid may be inserted into an interior chamber of the equipment being cleaned, a diaphragm that is at least partially filled with a fluid may be positioned between the probe and the equipment, etc.

At 606, ultrasound pulses are emitted by the probe through the coupling medium to the equipment in order to remove deposits. The frequency and wavelength of the pulses may be controlled to remove deposits from exterior or interior surfaces of the equipment, as described above. In one embodiment, one or more pulses may be emitted and the echoes of the pulses examined in order to determine if deposits are present, to determine where the deposits are located, and/or to determine a thickness dimension of the equipment. As described above, the wavelength of the ultrasound pulses may be based on the thickness dimension so that the probe can remove the deposits from interior surfaces without the probe being located in the interior chambers of the equipment.

At 608, a determination is made as to whether the deposit has been removed from the equipment. In one embodiment, an operator of the cleaning system may visually inspect the equipment with or without the aid of an optical sensor to determine if a deposit has been removed. Optionally, the ultrasound probe may emit investigative ultrasound pulses toward the location of a deposit and the echoes of the pulses may be examined to determine if the deposit has been removed. In another example, another type of sensor may be used. For example, a distance sensor (e.g., an eddy-current noncontact displacement position sensor) may be used to measure distances to the surfaces. If the deposits are present, then the measured distance will be smaller (due to the presence of the deposits) than surfaces that do not have the deposits. If the deposit has been removed, then flow of the method 600 may proceed toward 610. If the deposit has not been removed, then cleaning of the equipment to remove the deposit may continue by flow of the method 600 returning toward 606. At 610, the probe may be moved to another location in order to clean one or more additional areas of the equipment. Flow of the method 600 may return toward 606 to clean the one or more additional areas. Alternatively, flow of the method 600 may terminate following 608.

Figure 7:
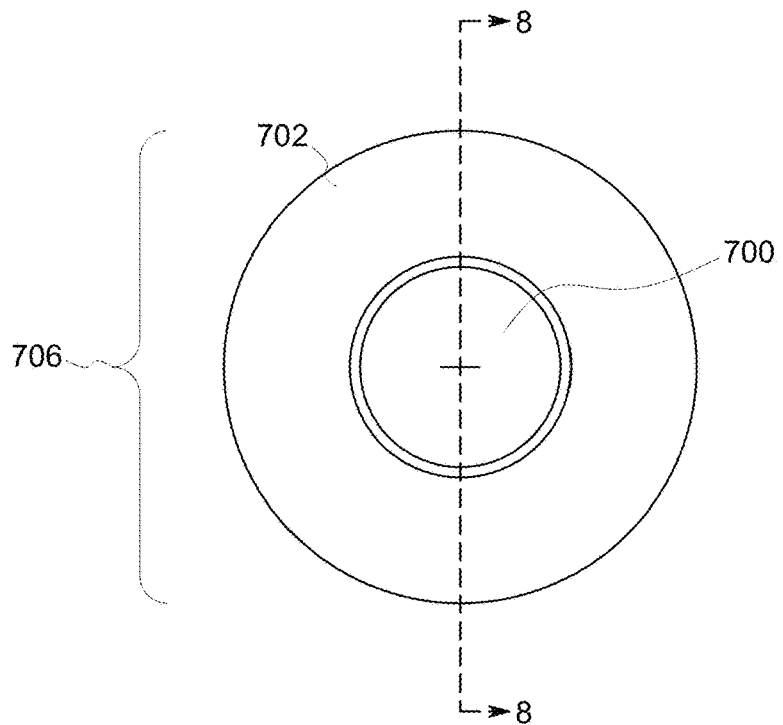
FIG. 7 illustrates a front view of a combination ultrasound probe according to one embodiment.
Figure 8:
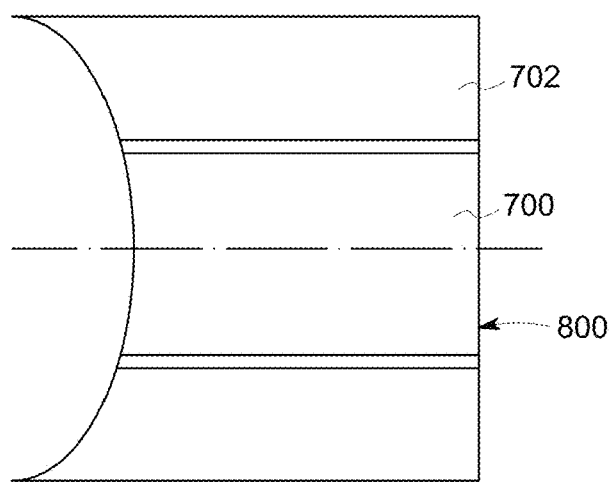
FIG. 8 illustrates a cross-sectional view of the ultrasound probe shown along line 8-8 shown in FIG. 7 according to one embodiment.

FIG. 7 illustrates a front view of a combination ultrasound probe 706 according to one embodiment. FIG. 8 illustrates a cross-sectional view of the ultrasound probe 706 shown along line 8-8 shown in FIG. 7 according to one embodiment. The probe 706 may represent one embodiment of the probe 106 shown in FIG. 1. The probe 706 includes different transducer portions 700, 702. The portions 700, 702 represent different ultrasound transducer or groups of transducers that may be separately excited to emit ultrasound waves and to separately receive ultrasound echoes. The inner portion 700 may be smaller (e.g., in terms of surface area shown in FIG. 7) than the outer portion 702. The inner portion 700 may be disposed inside the outer portion 702, with the outer portion 702 extending or surrounding the outer perimeter or circumference of the inner portion 700. The inner portion 700 may be excited to emit diagnostic ultrasound pulses and the outer portion 702 may be excited to emit cleaning ultrasound pulses from a common face or surface 800 of the probe 706. The diagnostic ultrasound pulses may have different frequencies than the cleaning ultrasound pulses, and may be more suitable to locate and measure the thickness of the deposits. As shown in FIG. 7, the smaller portion 700 may be placed inside a cut-out or void that is concentric to the larger portion 702.

In one embodiment, a cleaning system includes an ultrasound probe, a coupling mechanism, a scanning mechanism, and a controller. The ultrasound probe is configured to enter into an engine while the engine is one or more of coupled with or disposed within a vehicle. The ultrasound probe also is configured to emit an ultrasound pulse. The coupling mechanism is configured to provide an ultrasound coupling medium between the ultrasound probe and one or more components of the engine. The ultrasound probe is configured to be scanned, manually, automatically, or in a way that combines both manual and automatic scanning, to cover the region of deposits to be cleaned. The controller is configured to drive the ultrasound probe to deliver the ultrasound pulse through the coupling medium to a surface of the one or more components of the engine. The ultrasound probe is configured to deliver the ultrasound pulse to remove deposits from the one or more components of the engine while the engine is one or more of coupled with or disposed within the vehicle.

In one aspect, the ultrasound probe is configured to enter into the engine that is coupled with a wing of an aircraft.

In one aspect, the coupling mechanism is configured to provide the coupling medium between the ultrasound probe and one or more blades, nozzles, combustor liners, or compressor blades of the engine.

In one aspect, the surface of the one or more components of the engine is an external surface. The ultrasound probe can be a focused ultrasound probe configured to focus the ultrasound pulse toward the exterior surface of the one or more components of the engine.

In one aspect, the coupling mechanism includes a nozzle configured to supply the coupling medium onto the one or more components of the engine.

In one aspect, the coupling mechanism includes a diaphragm that is at least partially filled with the ultrasound coupling medium and that is configured to engage the one or more components of the engine between the ultrasound probe and the one or more components.

In one aspect, the ultrasound probe is configured to focus the ultrasound pulse toward the surface of the one or more components of the engine to remove the deposits while preventing removal of a thermal barrier coating on the one or more components of the engine.

In one aspect, the ultrasound probe is configured to be moved relative to the one or more components of the engine to remove the deposits from different areas of the one or more components.

In one aspect, the system also includes an optical sensor configured to generate optical data representative of the one or more components of the engine during removal of the deposits by the ultrasound probe.

In one aspect, the surface of the one or more components of the engine is an internal surface and the one or more components include an opposite external surface. The coupling mechanism can be configured to provide the coupling medium from the ultrasound probe to the external surface and the controller is configured to direct the ultrasound probe to focus the ultrasound pulse on the external surface of the one or more components of the engine to remove the deposits from the external surface.

In one aspect, the surface of the one or more components of the engine is an external surface and the one or more components include an opposite internal surface. The coupling mechanism can be configured to provide the coupling medium from the ultrasound probe to the external surface and the controller is configured to direct the ultrasound probe to focus the ultrasound pulse through the external surface of the one or more components of the engine and onto the internal surface to remove the deposits from the internal surface.

In one aspect, the one or more components include an internal cavity that is at least partially bounded by the internal surface. The coupling mechanism also can be configured to at least partially fill the internal cavity with the ultrasound coupling medium or a different fluid.

In one aspect, the ultrasound probe is configured to direct the ultrasound pulse toward the internal cavity and cause acoustic effects (e.g., cavitation) about the internal cavity for removing the deposits from the internal surface.

In one aspect, the controller is configured to change a frequency of the ultrasound pulse delivered by the ultrasound probe based on a thickness of the one or more components between the internal surface and the external surface.

In one aspect, the controller is configured to change the frequency of the ultrasound pulse delivered by the ultrasound probe such that the thickness of the one or more components between the internal surface and the external surface is an odd integer multiple of half of an ultrasound wavelength in the ultrasound pulse.

In one aspect, the controller is configured to direct the ultrasound probe to emit an investigative pulse toward the one or more components of the engine and the ultrasound probe is configured to sense one or more echoes of the investigative pulse off of the one or more components of the engine.

In one aspect, the controller is configured to one or more of determine a thickness of the one or more components or determine a presence or absence of the deposits on the one or more components based on the one or more echoes.

In one aspect, the controller is configured to determine a frequency of the ultrasound pulse based on the one or more echoes.

In another embodiment, a method (e.g., for cleaning equipment of a system) includes inserting an ultrasound probe into an engine while the engine is one or more of coupled with or disposed within a vehicle, delivering an ultrasound coupling medium between the ultrasound probe and one or more components of the engine, and emitting an ultrasound pulse from the ultrasound probe and through the coupling medium to a surface of the one or more components of the engine. The ultrasound pulse removes deposits from the one or more components of the engine while the engine is one or more of coupled with or disposed within the vehicle.

In one aspect, the surface of the one or more components of the engine is an external surface, and emitting the ultrasound pulse includes focusing the ultrasound pulse toward the exterior surface of the one or more components of the engine.

In one aspect, delivering the ultrasound coupling medium includes spraying the coupling medium onto the one or more components of the engine.

In one aspect, delivering the ultrasound coupling medium includes engaging the surface of the one or more components of the engine with a diaphragm that is at least partially filled with the ultrasound coupling medium.

In one aspect, emitting the ultrasound pulse removes the deposits from the surface of the one or more components of the engine while preventing removal of a thermal barrier coating on the one or more components of the engine.

In one aspect, the method also includes moving the ultrasound probe relative to the one or more components of the engine to remove the deposits from different areas of the one or more components.

In one aspect, the method also includes obtaining optic data representative of the one or more components of the engine from an optical sensor during removal of the deposits by the ultrasound probe.

In one aspect, the surface of the one or more components of the engine is an internal surface and the one or more components include an opposite external surface. The coupling medium can be delivered onto the external surface and the ultrasound pulse is emitted toward the external surface of the one or more components of the engine to remove the deposits from the external surface.

In one aspect, the surface of the one or more components of the engine is an external surface and the one or more components include an opposite internal surface. The coupling medium can be delivered onto the external surface. Emitting the ultrasound pulse can include focusing the ultrasound pulse through the external surface of the one or more components of the engine and onto the internal surface to remove the deposits from the internal surface.

In one aspect, the one or more components include an internal cavity that is at least partially bounded by the internal surface. The method also can include at least partially filling the internal cavity with the ultrasound coupling medium or a different fluid.

In one aspect, emitting the ultrasound pulse includes directing the ultrasound pulse toward the internal cavity and creating acoustic effects (e.g., cavitation) about the internal cavity for removing the deposits from the internal surface.

In one aspect, the method also includes changing a frequency of the ultrasound pulse delivered by the ultrasound probe based on a thickness of the one or more components between the internal surface and the external surface.

In one aspect, the method also includes changing the frequency of the ultrasound pulse delivered by the ultrasound probe such that the thickness of the one or more components between the internal surface and the external surface is an odd integer multiple of half of an ultrasound wavelength in the ultrasound pulse.

In one aspect, the method also includes emitting an investigative pulse with the ultrasound probe toward the one or more components of the engine and sensing one or more echoes of the investigative pulse off of the one or more components of the engine.

In one aspect, the method includes one or more of determining a thickness of the one or more components or determining a presence or absence of the deposits on the one or more components based on the one or more echoes.

In one aspect, the method also includes determining a frequency of the ultrasound pulse based on the one or more echoes.

In another embodiment, a system (e.g., a cleaning system) includes an ultrasound probe and a controller. The ultrasound probe is configured to enter into equipment while the engine is coupled with or disposed within a vehicle system. The ultrasound probe also is configured to emit an ultrasound pulse. The controller is configured to drive the ultrasound probe to deliver the ultrasound pulse to a surface of the one or more components of the engine. The ultrasound probe also is configured to deliver the ultrasound pulse to remove deposits from the one or more components of the engine while the engine is one or more of coupled with or disposed within the vehicle.

In one aspect, the system also includes a coupling mechanism configured to provide an ultrasound coupling medium between the ultrasound probe and one or more components of the engine.

In one aspect, the ultrasound probe is configured to focus the ultrasound pulse toward the surface of the one or more components of the engine to remove the deposits while preventing removal of a thermal barrier coating on the one or more components of the engine.

In one aspect, the surface of the one or more components of the engine is an external surface and the one or more components include an opposite internal surface. The controller is configured to direct the ultrasound probe to focus the ultrasound pulse through the external surface of the one or more components of the engine and onto the internal surface to remove the deposits from the internal surface.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the inventive subject matter without departing from its scope. While the dimensions and types of materials described herein are intended to define the parameters of the inventive subject matter, they are by no means limiting and are exemplary embodiments. Many other embodiments will be apparent to one of ordinary skill in the art upon reviewing the above description. The scope of the inventive subject matter should, therefore, be determined with reference to the appended clauses, along with the full scope of equivalents to which such clauses are entitled. In the appended clauses, the terms "including" and "in which" are used as the plain-English equivalents of the respective terms "comprising" and "wherein." Moreover, in the following clauses, the terms "first," "second," and "third," etc. are used merely as labels, and are not intended to impose numerical requirements on their objects. Further, the limitations of the following clauses are not written in means-plus-function format and are not intended to be interpreted based on 35 U.S.C. § 112(f), unless and until such clause limitations expressly use the phrase "means for" followed by a statement of function void of further structure.

This written description uses examples to disclose several embodiments of the inventive subject matter and also to enable a person of ordinary skill in the art to practice the embodiments of the inventive subject matter, including making and using any devices or systems and performing any incorporated methods. The patentable scope of the inventive subject matter may include other examples that occur to those of ordinary skill in the art. Such other examples are intended to be within the scope of the clauses if they have structural elements that do not differ from the literal language of the clauses, or if they include equivalent structural elements with insubstantial differences from the literal languages of the clauses.

The foregoing description of certain embodiments of the inventive subject matter will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks (for example, processors or memories) may be implemented in a single piece of hardware (for example, a general purpose signal processor, microcontroller, random access memory, hard disk, and the like). Similarly, the programs may be stand-alone programs, may be incorporated as subroutines in an operating system, may be functions in an installed software package, and the like. The various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "an embodiment" or "one embodiment" of the inventive subject matter are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above-described systems and methods without departing from the spirit and scope of the inventive subject matter herein involved, it is intended that all of the subject matter of the above description or shown in the accompanying drawings shall be interpreted merely as examples illustrating the inventive concept herein and shall not be construed as limiting the inventive subject matter.

As used herein, a structure, limitation, or element that is "configured to" perform a task or operation is particularly structurally formed, constructed, programmed, or adapted in a manner corresponding to the task or operation. For purposes of clarity and the avoidance of doubt, an object that is merely capable of being modified to perform the task or operation is not "configured to" perform the task or operation as used herein. Instead, the use of "configured to" as used herein denotes structural adaptations or characteristics, programming of the structure or element to perform the corresponding task or operation in a manner that is different from an "off-the-shelf" structure or element that is not programmed to perform the task or operation, and/or denotes structural requirements of any structure, limitation, or element that is described as being "configured to" perform the task or operation.

What is claimed is:

1. A method comprising:
   inserting an ultrasound probe into an engine;
   delivering an ultrasound coupling medium between the ultrasound probe and one or more components of the engine, the ultrasound coupling medium acoustically coupling the ultrasound probe with the one or more component of the engine;
   emitting a focused ultrasound pulse from the ultrasound probe and through the ultrasound coupling medium to deposits on a surface of the one or more components of the engine;
   removing the deposits from the one or more components of the engine via the focused ultrasound pulse transmitted to the deposits, through the ultrasound coupling medium, from the ultrasound probe;
   wherein the surface of the one or more components of the engine is an external surface and the one or more components include an opposite internal surface, and wherein the ultrasound coupling medium is delivered onto the external surface, and wherein emitting the focused ultrasound pulse includes focusing the ultrasound pulse through the ultrasound coupling medium delivered on the external surface of the one or more components of the engine and onto the internal surface to remove the deposits from the internal surface; and
   changing a frequency of the focused ultrasound pulse delivered by the ultrasound probe based on a thickness of the one or more components between the internal surface and the external surface.

2. The method of claim 1, wherein delivering the ultrasound coupling medium includes spraying the ultrasound coupling medium onto the one or more components of the engine.

3. The method of claim 1, wherein delivering the ultrasound coupling medium includes engaging the surface of the one or more components of the engine with a diaphragm that is at least partially filled with the ultrasound coupling medium.

4. The method of claim 1, wherein the focused ultrasound pulse removes the deposits from the surface of the one or more components of the engine while preventing removal of a thermal barrier coating on the one or more components of the engine.

5. The method of claim 1, further comprising obtaining optical data representative of the one or more components of the engine from an optic sensor during removal of the deposits by the focused ultrasound pulse.

6. The method of claim 1, wherein the frequency of the focused ultrasound pulse is varied such that the thickness of the one or more components is one half of a wavelength of the focused ultrasound pulse.

7. The method of claim 1, wherein the frequency of the focused ultrasound pulse is varied such that the thickness of the one or more components is an odd integer multiple of a wavelength of the focused ultrasound pulse.

8. The method of claim 1, wherein the ultrasound probe comprises the ultrasound coupling medium disposed on a distal end of the ultrasound probe, the ultrasound coupling medium comprising gallium, gallium-indium alloy, or combinations thereof.

9. The method of claim 1, wherein the ultrasound probe comprises an inner transducer portion configured to emit a diagnostic pulse and an outer transducer portion configured to emit the focused ultrasound pulse, and wherein the method further comprises emitting a diagnostic pulse from the inner transducer portion at a frequency different from the focused ultrasound pulse, to locate and measure a thickness of the deposits.

\* \* \* \* \*